US007555075B2

(12) United States Patent
Pessoa et al.

(10) Patent No.: US 7,555,075 B2
(45) Date of Patent: Jun. 30, 2009

(54) ADJUSTABLE NOISE SUPPRESSION SYSTEM

(75) Inventors: Lucio F. C. Pessoa, Cedar Park, TX (US); Roman A. Dyba, Austin, TX (US); David B. Melles, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 565 days.

(21) Appl. No.: 11/400,458

(22) Filed: Apr. 7, 2006

(65) Prior Publication Data

US 2007/0237271 A1 Oct. 11, 2007

(51) Int. Cl.
*H03D 1/04* (2006.01)

(52) U.S. Cl. ....................................... 375/346; 375/285

(58) Field of Classification Search ................. 375/232, 375/346, 350, 296, 284, 285, 278; 704/227
See application file for complete search history.

(56) References Cited

U.S. PATENT DOCUMENTS 5,659,622 A 8/1997 Ashley
5,933,495 A * 8/1999 Oh ........................ 379/406.08
5,937,377 A * 8/1999 Hardiman et al. ........... 704/225
6,233,549 B1 * 5/2001 Mauro et al. ................ 704/207
6,366,880 B1 4/2002 Ashley
6,862,567 B1 3/2005 Gao
2003/0040908 A1 * 2/2003 Yang et al. .................. 704/233
2004/0049383 A1 * 3/2004 Kato et al. .................. 704/226
2004/0052384 A1 3/2004 Ashley et al.
2004/0148166 A1 * 7/2004 Zheng ........................ 704/233
2005/0278172 A1 * 12/2005 Koishida et al. ............ 704/227

OTHER PUBLICATIONS

3GPP2 C.S0014-A, Version 1.0 Apr. 2004 Enhanced Variable Rate Codec, Speech Service Option 3 for Wideband Spread Spectrum Digital Systems.
IEEE Transactions on Acoustics, Speech, and Signal Processing; vol. ASSP-27,No. 2, Apr. 1979 Steven F. Boll, Suppression of Acoustic Noise in Speech.
Background Noise Supression for Speech Enhancement and Coding, IEEE 1997, T.Ramabadran, J.Ashley, M.McLaughlin.
International Search Report and Written Opinion relating to PCT/US07/63044.

* cited by examiner

*Primary Examiner*—Emmanuel Bayard
(74) *Attorney, Agent, or Firm*—Charles W. Bethards

(57) ABSTRACT

Methods and corresponding systems for suppressing noise in an input signal include setting a minimum overall gain in a noise reduction processor for processing a first frame of data associated with the input signal. In response to a new minimum overall gain being set, the minimum overall gain in the noise reduction processor is replaced with the new minimum overall gain, and a second frame of data associated with the input signal is processed to suppress noise using the new minimum overall gain. The new minimum overall gain can be a function of the input signal or an output signal of the noise reduction processor. The new minimum overall gain can correspond to a difference between an estimated signal-to-noise ratio (SNR) improvement that is calculated using time-domain data and a target SNR improvement.

19 Claims, 5 Drawing Sheets

ADJUSTABLE NOISE SUPPRESSION SYSTEM

FIELD OF THE INVENTION

This invention relates in general to data communication, and more specifically to techniques and apparatus for suppressing noise in a signal in a communication system.

BACKGROUND OF THE INVENTION

High-level background noise in a wired or wireless telecommunications channel degrades in-band signaling and lowers the perceived voice quality of speech signals. To ensure quality of service in voice-band transmission, noise suppressors, or noise reducers, are used to reduce the degradation caused by the background noise and to improve the signal-to-noise ratio (SNR) of noisy signals.

Many popular noise reduction/suppression algorithms use the principles of spectral weighting. Spectral weighting means that different spectral regions of the mixed signal of speech and noise are attenuated or modified with different gain factors. The goal is to obtain a speech signal that contains less noise than the original speech signal. At the same time, the speech quality must remain substantially intact with a minimal distortion of the original speech.

Spectral weighting is typically performed in the frequency domain using the well-known Fourier transform. Voice activity detectors are used to determine whether current signal samples represent predominantly voice or noise. Energy estimators and signal-to-noise ratio estimators are used to calculate a factor that is then used to modify the level of a frequency-domain signal. The signal to noise ratio is a measure of signal strength (e.g., voice strength) relative to background noise. The frequency-domain signal as modified is then converted back to the time-domain.

One problem with noise suppressors is that the level of suppression can be too high or too low under various different conditions. Additionally, a noise suppressor that operates in the frequency domain, like the spectral weighting filter, can leave artifacts in the output signal, such as musical noise, jet engine roar, running water, or the like.

BRIEF DESCRIPTION OF THE DRAWINGS

The accompanying figures, wherein like reference numerals refer to identical or functionally similar elements throughout the separate views and which together with the detailed description below are incorporated in and form part of the specification, serve to further illustrate various embodiments and to explain various principles and advantages, all in accordance with the present invention.

DETAILED DESCRIPTION

In overview, the present disclosure concerns noise suppression in voice enhancement devices. More particularly various inventive concepts and principles embodied in methods and apparatus may be used for adjusting a minimum overall gain, i.e., level of noise suppression, in a noise suppression system in a voice enhancement device.

While the voice enhancement device of particular interest may vary widely, one embodiment may advantageously be used in a wireless communication system or a wireless networking system, such as a cellular wireless network. Additionally, the inventive concepts and principles taught herein can be advantageously applied to wired communications systems, such as a telephone system.

The instant disclosure is provided to further explain, in an enabling fashion, the best modes, at the time of the application, of making and using various embodiments in accordance with the present invention. The disclosure is further offered to enhance an understanding and appreciation for the inventive principles and advantages thereof, rather than to limit the invention in any manner. The invention is defined solely by the appended claims, including any amendments made during the pendency of this application, and all equivalents of those claims as issued.

It is further understood that the use of relational terms, if any, such as first and second, top and bottom, and the like, are used solely to distinguish one entity or action from another without necessarily requiring or implying any such actual relationship or order between such entities or actions.

Much of the inventive functionality and many of the inventive principles are best implemented with, or in, integrated circuits (ICs), including possibly application specific ICs, or ICs with integrated processing controlled by embedded software or firmware. It is expected that one of ordinary skill, when guided by the concepts and principles disclosed herein, will be readily capable of generating such software instructions and programs and ICs with minimal experimentation—notwithstanding possibly significant effort and many design choices motivated by, for example, available time, current technology, and economic considerations. Therefore, in the interest of brevity and minimization of any risk of obscuring the principles and concepts according to the present invention, further discussion of such software and ICs, if any, will be limited to the essentials with respect to the principles and concepts of the various embodiments.

Figure 1:
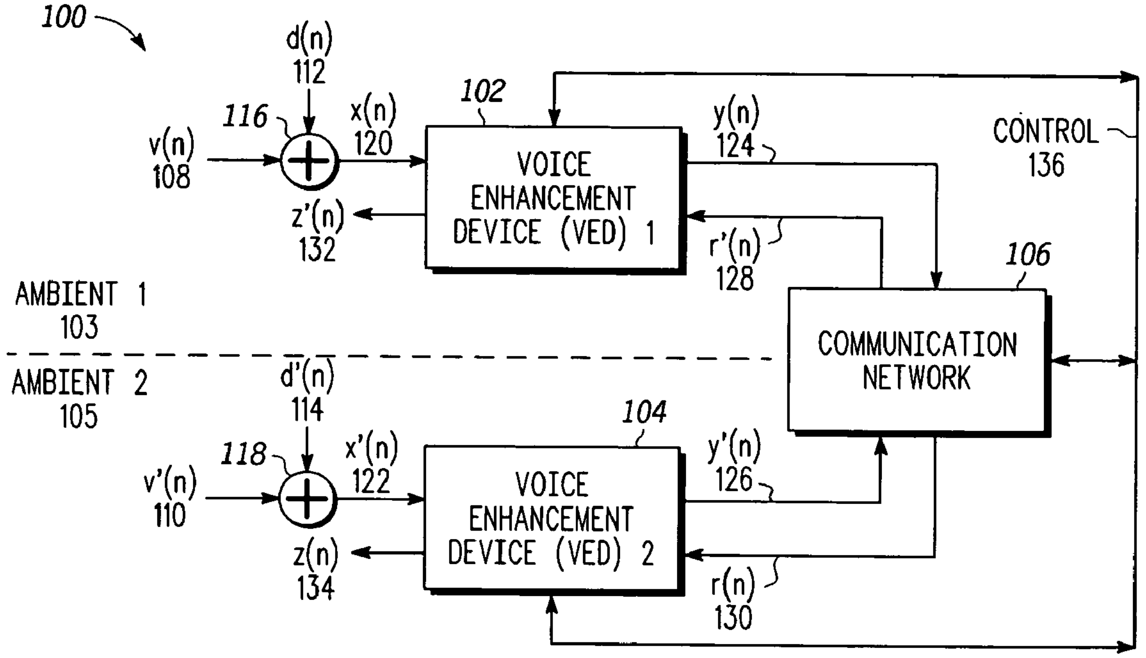
FIG. 1 depicts, in a simplified and representative form, a high-level block diagram of a communications system having voice enhancement devices connected through a communication channel in accordance with one or more embodiments.

Referring to FIG. 1, there is depicted, in a simplified and representative form, a high-level block diagram of communications system 100 having voice enhancement devices 102 and 104 connected through communication network (or communication channel) 106 in accordance with one or more embodiments. Voice enhancement devices 102 and 104 are generally devices for processing, filtering, and conditioning a voice signal to improve the voice quality and sound clarity of wireless and wired signals before they are transmitted through a communication network, such as communication network 106. Communication network 106 can be a wired or wireless communication network.

When a telephone, radio, or cell phone is used, signals, e.g., voice signals v(n) 108 and v'(n) 110 or the like are combined, respectively, with noise signals d(n) 112 and d'(n) 114, which are shown at adders 116 and 118, to produce input signals x(n) 120 and x'(n) 122. Noise signals 112 and 114 include the effects of ambient sounds 103 and 105 (i.e., sounds that surround the user who is the source of the voice signal), respectively, in addition to any noise or distortion caused by the equipment or the environment, such as the acoustics of the microphones, electronic interference or any electronic processing of the signal before voice signals 108 and 110 are input into voice enhancement devices 102 and 104. Ambient sounds 103 and 105 can include, for example, road and wind noise in a car, motor or machine noises, construction site noises, background music, background conversations, and the like.

Voice enhancement devices 102 and 104 produce output signals y(n) 124 and y'(n) 126, respectively. Output signals 124 and 126 are then sent through communication network 106 where they are output as received signals r(n) 130 and r'(n) 128, respectively. Received signals 128 and 130 can be delayed, and can have missing packets, and other anomalies due to propagation through the communication network.

Received signals 128 and 130 can also be processed by voice enhancement devices 102 and 104, and output as received signals, e.g., voice signals z'(n) 132 and z(n) 134, respectively. Received voice signals 132 and 134 can then be output by a speaker or headphone for the user to hear.

Figure 2:
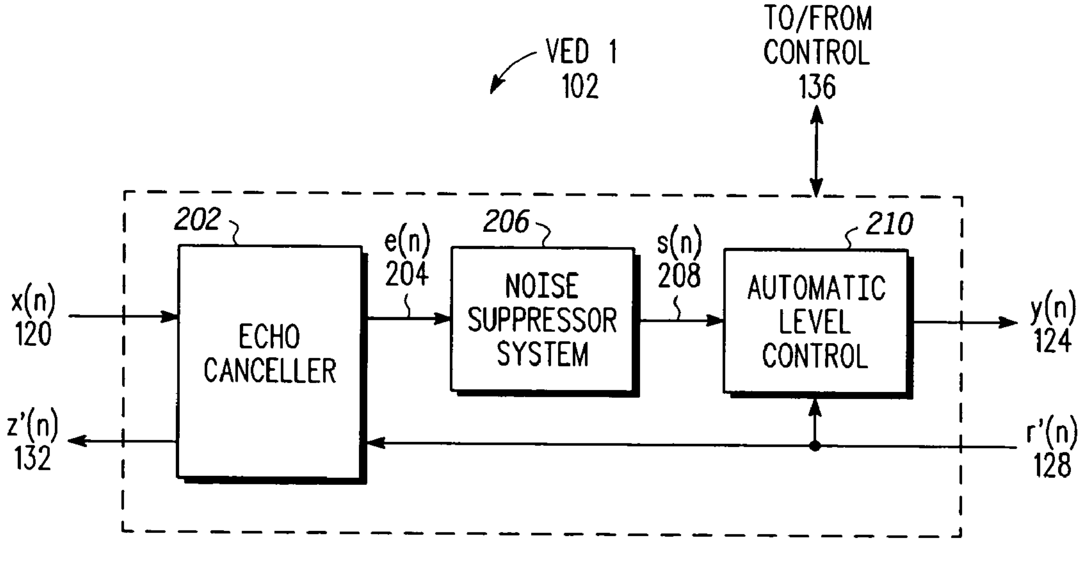
FIG. 2 is a more detailed representative block diagram of a voice enhancement device in accordance with one or more embodiments.

With reference now to FIG. 2, there is depicted a more detailed representative block diagram of a voice enhancement device in accordance with one or more embodiments. Voice enhancement device 102 can include echo canceller 202, which produces an output signal e(n) 204 that is input into noise suppressor system 206. Noise suppressor system 206 produces an output signal s(n) 208, which can be input into automatic level control 210. The output of automatic level control 210 is output signal 124.

Echo canceller 202 is generally known and receives input signal 120, and receive signal 128, and processes the signals to remove unwanted echo signals. Such echo signals can come from electrical mismatches or from acoustical coupling between a speaker and microphone, and the echo typically affects input signal 120 by an additive echo signal that depends on the received signal 128. Thus, output signal 204 from echo canceller 202 is expected to have a reduced echo signal level.

Noise suppressor system 206 receives signal 204 as an input signal for processing and suppressing noise. The output of noise suppressor system 206 is signal 208. Noise suppressor system 206 can be implemented using one of several known processes and systems as modified and improved in accordance with one or more of the inventive concepts and principles discussed and disclosed herein. One such process and system uses the noise suppression algorithm described in telecommunications standard IS-127, which is known as the Enhanced Variable Rate Coder (EVRC) standard published by the Telecommunications Industry Association (TIA), Arlington, Va., 22201-3834, USA. This algorithm is also similar to the noise suppression system disclosed in U.S. Pat. No. 5,659,622 issued to Ashley. Note that one of the initial weighting rules proposed for audio noise reduction was that of spectral subtraction [see, S. F. Boll, Suppression of Acoustic Noise in Speech Using Spectral Subtraction, IEEE Trans. on Acoust. Speech, and Sign. Proc., Vol. ASSP-27, No. 2., April 1979, pp. 113-120]. One of its versions is the magnitude spectral subtraction. Although the noise level can be reduced by the spectral subtraction, its direct application poses a disadvantage, as the processed signal may sound unnatural, and processing may cause an effect known as "musical noise."

The components in noise suppressor system 206, its operation, and various inventive concepts and principles, are discussed in greater detail below.

Automatic level control 210 is generally known and operates to adjust the volume of input signal 208 to produce output signal 124. Automatic level control 210 analyzes the volume level of received signal 128 when processing input signal 208 and makes level control adjustments based upon the level of the received signal 128. For example, if received signal 128 is large, automatic level control 210 may not make any level control adjustments. Automatic level control 210 may also need to estimate the ratio of input signal 208 to received signal 128 in order to increase the level of output signal 124.

Other components or functions that can be included in voice enhancement device 102 include, for example, an acoustic echo suppressor, a tone indicator/detector, a selective-band filter, and the like.

Figure 3:
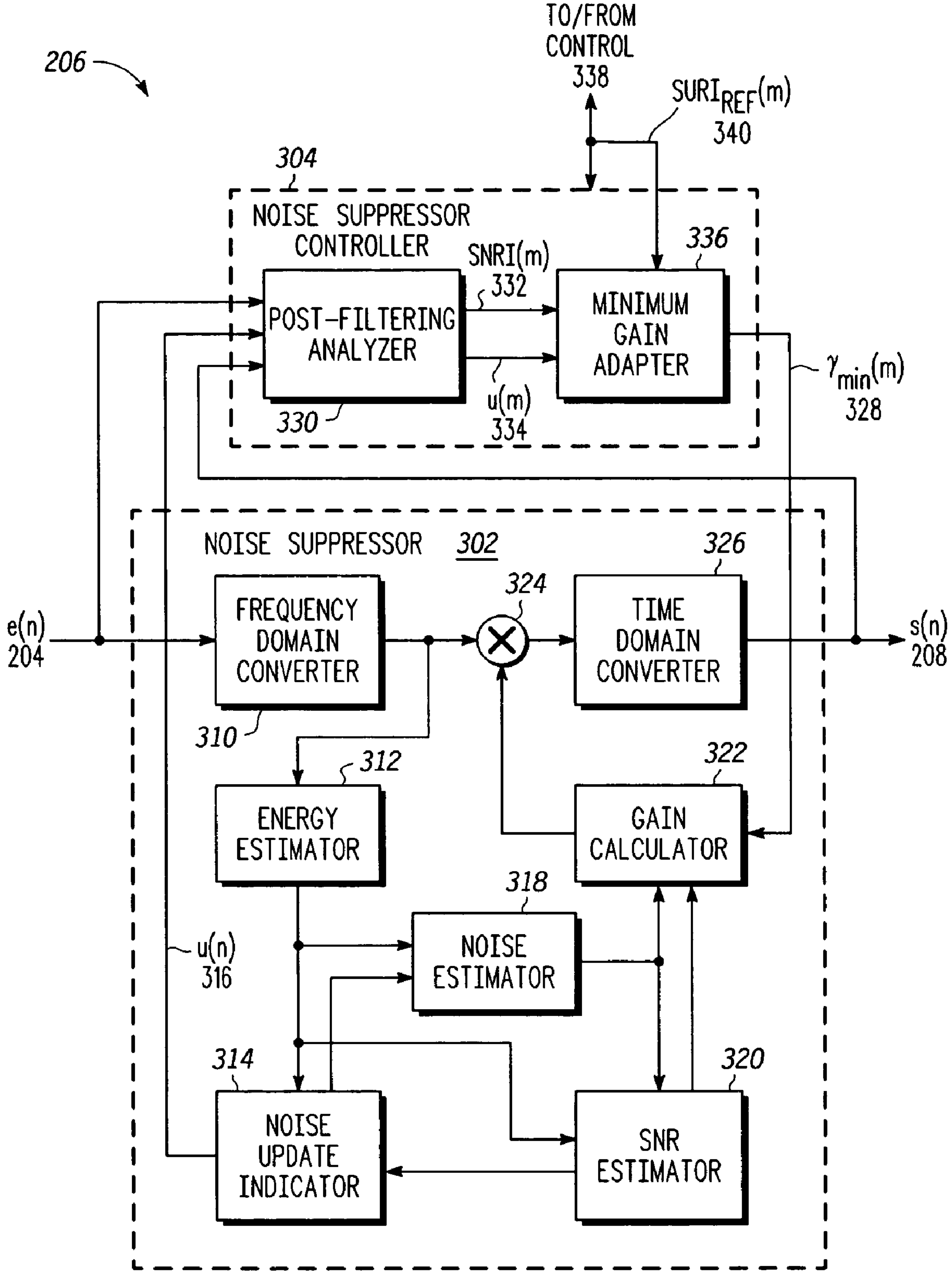
FIG. 3 depicts a block diagram of a noise suppressor system in accordance with one or more embodiments.

With reference now to FIG. 3, there is depicted a block diagram representation of a noise suppressor system, such as noise suppressor system 206 or another similar system, in accordance with one or more embodiments. Noise suppressor system 206 includes noise suppressor 302 (which can also be called a noise reduction processor) and noise suppressor controller 304, which controls a minimum overall gain setting of noise suppressor 302 using a post-filtering analyzer that analyzes time-domain data.

Noise suppressor 302 receives input signal 204 into frequency-domain converter 310. Frequency-domain converter 310 converts the time-domain input signal 204 into a frequency-domain signal. This frequency-domain conversion can include high-pass filtering, pre-emphasis filtering, windowing, and a fast Fourier transform (FFT) operation. The high-pass filtering can be represented by the equation (see IS-127 for filter coefficient values):

$$H_{HPF}(z) = \prod_{j=1}^{3} \frac{a_{j0} + a_{j1}z^{-1} + a_{j2}z^{-2}}{1 + b_{j1}z^{-1} + b_{j2}z^{-2}}$$

The pre-emphasis filtering can be represented by the equation:

$$H_{PE}(z)=1-0.8\,z^{-1}$$

The windowing operation can use a trapezoidal window with 10 ms frames, 3 ms overlapping, and 3 ms zero-padding, which results in a 16 ms data frame that is then processed though a standard FFT operation to generate a frequency-domain signal, $G_m(k)$.

The frequency-domain signal $G_m(k)$ can include one or more signals representing frequency ranges, or frequency bands, or channels, of the input signal. In one embodiment, the input signal is subdivided into sixteen channels (or sub-bands) of frequency-domain data corresponding to sixteen frequency ranges.

The frequency-domain signal $G_m(k)$ is coupled to an input of energy estimator 312, which estimates the energy in each of the one or more channels of the current frame (m) of the frequency-domain signal using the following equation:

$$E_c(m,i)=\frac{1}{f_H(i)-f_L(i)+1}\sum_{k=f_L(i)}^{f_H(i)}|G_m(k)|^2$$

$$E(m,i)=\mathrm{Max}\{0.0625,\ 0.45E(m-1,i)+0.55E_c(m,i)\}$$

The output of energy estimator 312 is coupled to an input of noise update indicator 314, which produces a noise indicator signal u(n) 316 (which may also be known as an "update_flag"). Noise indicator signal u(n) 316 indicates whether the current frame is noise data or voice data. The process of classifying noise or voice data is a function of a voice metric calculation and spectral deviation estimator, which is explained in detail within IS-127. Noise indicator signal u(n) 316 is set to one (i.e., u(n)=update_flag=1) whenever the current frame is regarded as noise, and it is used to control the periods of time when noise estimator 318 is actively estimating noise.

The output of energy estimator 312 is also coupled to an input of noise estimator 318, and signal to noise ratio (SNR) estimator 320. Noise estimator 318 estimates noise energy in each of the one or more channels and performs calculations similar to energy estimator 312. The output of noise estimator 318 can be represented by the following formula (for noise frames, i.e. having update_flag=1):

$$E_N(m,i)=\mathrm{Max}\{0.065,0.9E_N(m-1,i)+0.1E(m,i)\}$$

SNR estimator 320 receives energy estimates from energy estimator 312 and noise estimates from noise estimator 318, and produces SNR estimates for each of the one or more channels. These channel SNR estimates can be represented by the formula:

$$\sigma_q(i)=\mathrm{Max}\left\{0,\ \mathrm{Min}\left\{89,\ \mathrm{Round}\left(10\log_{10}\left(\frac{E(m,i)}{E_N(m,i)}\right)\Big/0.375\right)\right\}\right\}$$

$$\sigma''_q(i)=\mathrm{Max}\{6,\ \sigma'_q(i)\}$$

Where $\sigma'_q(i)$ is equal to $\sigma_q(i)$ or equal to one, depending on the noise update decision (see IS-127).

SNR estimator 320 has outputs that provide SNR estimates to noise update indicator 314 and gain calculator 322. The SNR estimates are used in noise update indicator 314 to classify samples as either noise or voice in response to voice metric estimates (see IS-127).

With the noise estimates and the SNR estimates calculated for the frame, gain calculator 322 receives the estimates and calculates a gain for each of the one or more channels according to the formula:

$$\gamma(i)=\mathrm{Min}\{1,\ 10^{\gamma_{dB}(i)/20}\}$$

$$\gamma_{dB}(i)=0.39(\sigma''_q(i)-6)+\gamma'_T$$

$$\gamma'_T\mathrm{Max}\{\gamma_{min},\ \gamma_T(m)\}$$

$$\gamma_T(m)=-10\log_{10}\left(\sum_{i=0}^{15}E_N(m,i)\right)$$

Where $\gamma'_T$ is the total overall gain of 16 channel bands, $\gamma_T(m)$ is the unconstrained total overall gain and $\gamma_{min}$ is the minimum overall gain represented by the minimum overall gain control signal $\gamma_{min}(m)$ 328 (which is fixed at −13 dB in the prior art). Thus, the minimum overall gain is not a fixed constant—$\gamma_{min}(m)$ can be advantageously set as a function of time on a frame-by-frame basis under the control of noise suppressor controller 304, which performs a post-filtering analysis to calculate a new minimum overall gain.

The gains for each of the channels output by gain calculator 322 are used in gain modifier 324 to modify the frequency-domain signal $G_m(k)$ to produce a filtered frequency-domain signal $H_m(k)$, which may also be known as a noise-reduced signal spectrum.

Finally, filtered signal $H_m(k)$ is converted back into the time-domain by time-domain converter 326 (which can, for example, use a 16 ms Inverse Fast Fourier Transform (IFFT) operator), which produces noise-reduced output signal s(n) 208. Time-domain converter 326 can also include a de-emphasis filter having the equation:

$$H_{DE}(z)=\frac{1}{H_{PE}(z)}=\frac{1}{1-0.8z^{-1}}$$

To produce minimum overall gain control signal 328, noise suppressor controller 304 is coupled to input signal 204 and output signal 208 of noise suppressor 302. Post-filtering analyzer 330 receives input signal 204 and output signal 208, which are both time-domain signals. By examining both the input and the output signals of noise suppressor 302, post-filtering analyzer 330 can calculate an SNR improvement signal SNRI(m) 332 for each frame of noise, where such noise frames are indicated by signal u(m) 334. Noise indicator signal 316 can also be used in noise suppressor controller 304 in order to simplify and synchronize the process of distinguishing between noise and voice signals.

Once the SNR improvement signal SNRI(m) 334 has been calculated, minimum gain adapter 336 can compare SNRI(m) 332 to SNR improvement reference signal $SNRI_{REF}(m)$ 340 (which is one of control signals 338) to produce new minimum overall gain signal $\gamma_{min}(m)$ 328. The value represented by the SNR improvement reference signal 340 may also be known as a target SNR improvement. In one embodiment, minimum gain adapter 336 can use a least mean squares (LMS) algorithm to calculate new minimum overall gain signal 328 to control noise suppressor 302 in a way that will reduce the difference between the SNR improvement 332 and the SNR improvement reference 340 (in a mean squared sense).

Figure 4:
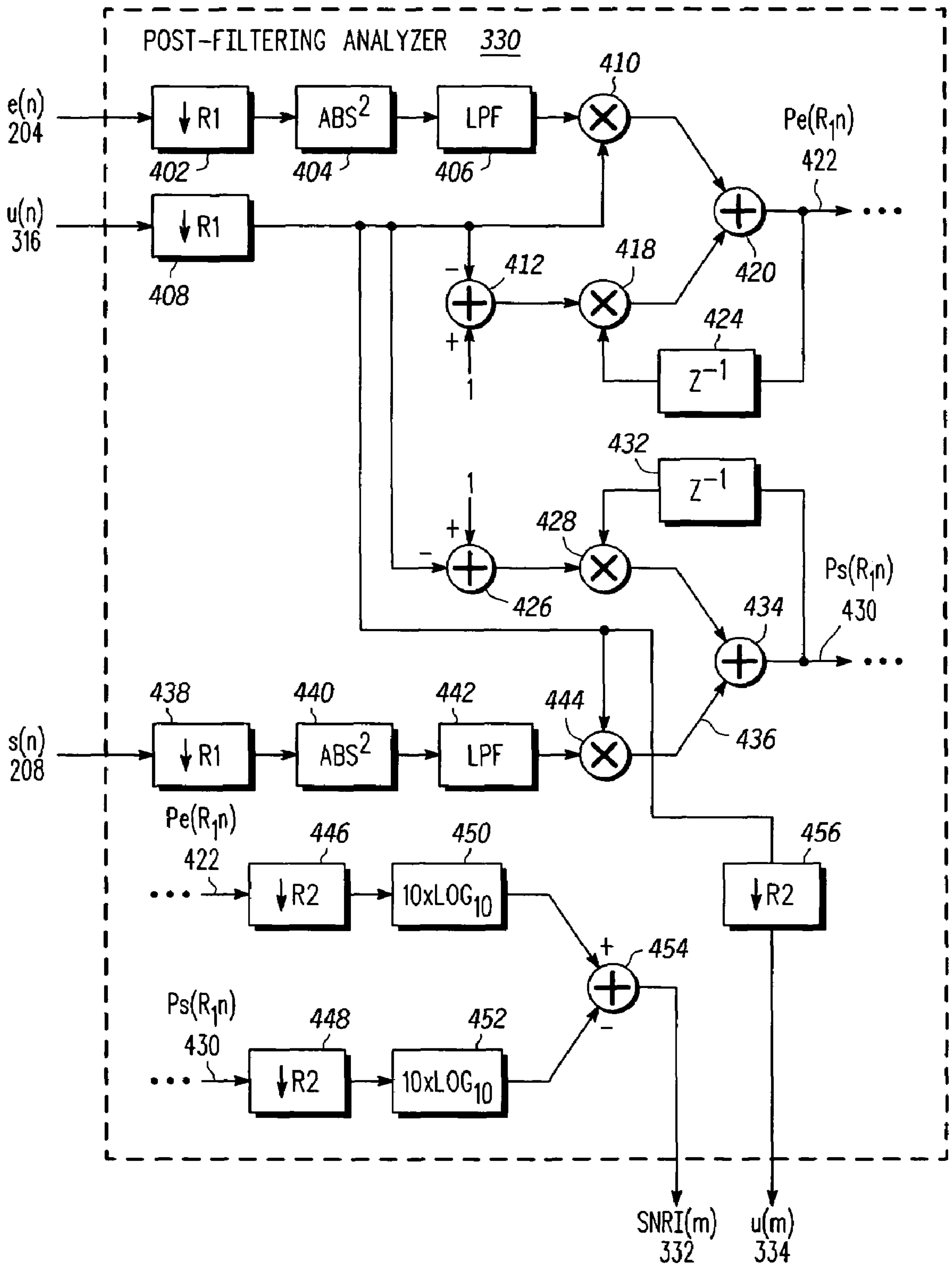
FIG. 4 shows a more detailed block diagram of a post-filtering analyzer that can be used in conjunction with the FIG. 3 noise suppressor system in accordance with one or more embodiments.

Referring now to FIG. 4, there is depicted a high-level schematic representation of a post-filtering analyzer that can be used in conjunction with the FIG. 3 noise suppressor system 206 in accordance with one or more embodiments. Post-filtering analyzer 330 receives input signal 204, output signal 208, and noise indicator signal 316 to produce SNR improvement signal 332 and noise frame indicator signal 334.

Input signal 204 is coupled to down sampler 402, which down samples the digital signal at a rate $R_1$. In one embodiment, $R_1$ can be ⅛ rate, which outputs every eighth sample.

The output of 402 is coupled to absolute value squared 404, which takes the absolute value of the sample and squares it. The purpose of 404 is to compute an instantaneous energy signal. The output of 404 is coupled to low pass filter 406 for averaging-out noise fluctuations affecting the output of 404. In one embodiment, low pass filter 406 operates according to the equation, where, in one embodiment, a=0.96875:

$$H_{LPF}(z) = \frac{1-a}{1-az^{-1}},\ 0 < a < 1.$$

At down sampler 408, noise indicator signal 316 (which is a binary signal indicating a noise sample) is down-sampled at the same rate, $R_1$, which is also the rate used at 402. The binary output of down sampler 408 and the output of low pass filter 406 are multiplied together at multiplier 410.

The output of 408 is also subtracted from 1 at adder 412, and the result is coupled to one input of multiplier 418. The other input of multiplier 418 is coupled to the output of delay 424, which is the output of adder 420 that has been delayed by one sample at rate $R_1$. The output of multiplier 418 is coupled to one input of adder 420, while the other input is coupled to the output of multiplier 410. The output of adder 420 is a signal, $P_e(R_1n)$ 422, corresponding to an estimated noise power of the input signal 204.

In a similar estimated noise power calculation for the output signal 208, input signal 208 is down sampled at rate $R_1$ at down sampler 438. Then, at 440, the absolute value of the signal is squared, and the result is passed through low pass filter 442, which is similar to low pass filter 406. The output of low pass filter 442 is coupled to multiplier 444, wherein it is multiplied by the output of down sampler 408. Since the output of down sampler 408 indicates the presence of a noise signal 316, the output of multiplier 444 is equal to zero when voice is present in a sample of signal 204. The output of multiplier 444 corresponds to estimated noise power in signal 208 when signal 316 indicates a noise sample.

The output of multiplier 444 is input to adder 434, which outputs an updated accumulation of estimated noise power when a noise sample is input, and outputs the previously accumulated estimated noise power when a voice sample is input. The other input to adder 434 is the previously accumulated noise estimate delayed by one sample at the rate $R_1$, as determined at adder 426 and multiplier 428. Thus, signal $P_s(R_1n)$ 430 corresponds to estimated noise power in output signal 208.

After the noise power has been estimated in the input and output signals 204 and 208 of noise suppressor 302, as represented by $P_e(R_1n)$ 422 and $P_s(R_1n)$ 430, respectively, the signal to noise ratio improvement signal SNRI(m) 332 is calculated by further down sampling these signals at rate $R_2$, as shown by down samplers 446 and 448. In one embodiment, rate $R_2$ is equal to the frame rate divided by $R_1$ (i.e., $R_1 \cdot R_2$ equals the frame rate). Noise indicator signal 316 (after being down sampled by down sampler 408) is also down sampled at rate $R_2$ by down sampler 456, which outputs noise frame indicator signal u(m) 334. Notice that both outputs 332 and 334 from post-filtering analyzer 330 are provided at a frame rate.

After the signals 422 and 430 are down sampled, they are input into logarithmic calculators 450 and 452. The output of logarithmic calculators 450 and 452 are input into adder 454, which calculates the SNR improvement SNRI(m) 332 in decibels for noise suppressor 302. The SNRI(m) 332 signal is the difference between the estimated noise in input signal 204 and the estimated noise in output signal 208.

Note that post-filtering analyzer 330 calculates signal-to-noise ratios of input signal 204 and output signal 208 using time-domain data to produce SNR improvement signal 332 that indicates the signal-to-noise ratio improvement of noise suppressor 302. These time-domain measurements are then used to compute minimum overall gain control signal 328 (at a frame rate), which controls a noise suppression process performed in the frequency-domain.

Figure 5:
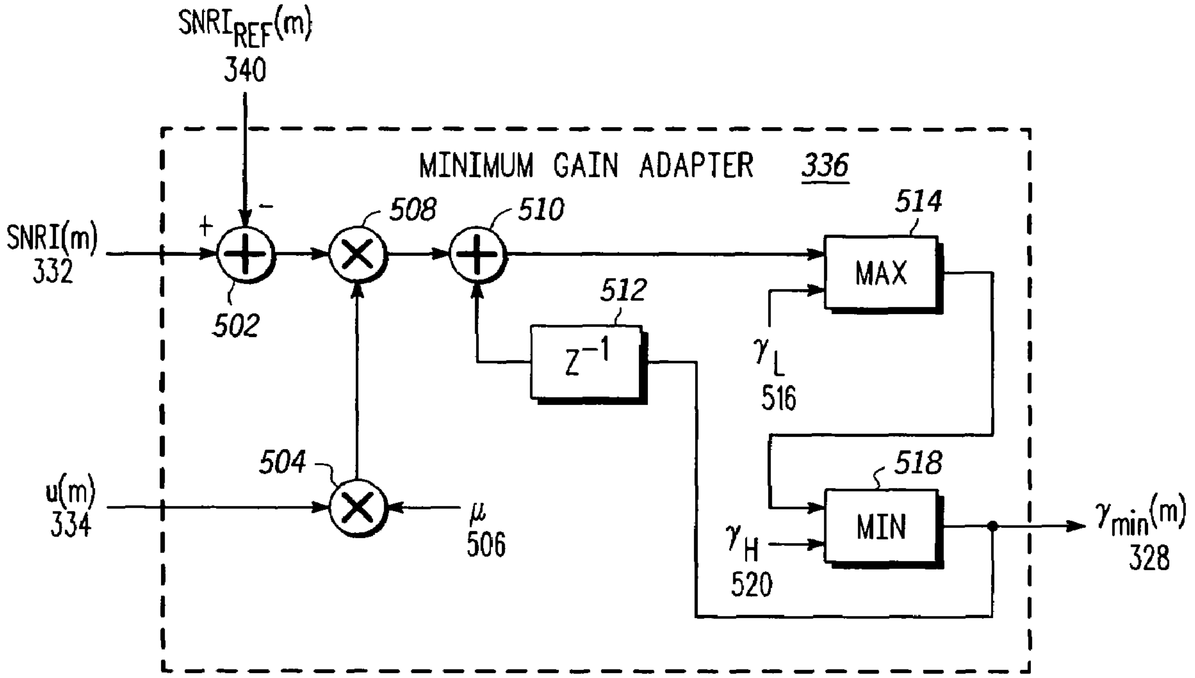
FIG. 5 depicts a more detailed block diagram of a minimum gain adapter that can be used in conjunction with the FIG. 3 noise suppressor system in accordance with one or more embodiments.

Turning now to FIG. 5, there is depicted a high-level block diagram of a minimum gain adapter that can be used in conjunction with the FIG. 3 noise suppressor system in accordance with one or more embodiments. Minimum gain adapter 336 receives SNR improvement signal 332 and SNR improvement reference signal 340 and computes a difference between the two at adder 502, i.e., an error signal. Noise frame indicator signal u(m) 334 is input into multiplier 504, where it is multiplied by the step size μ 506 for correcting the error signal output by adder 502. The error signal output by 502 is input into multiplier 508 where it is multiplied by the error correction step size from multiplier 504, if the frame is a noise frame.

The output of multiplier 508 is input into adder 510, where minimum overall gain control signal 328 from the previous frame, which has been delayed by 512, is added. In alternative embodiments, delay block 512 can be replaced by a multi-frame delay. The output of adder 510 is input into maximum signal processor 514, which does not allow the signal to fall below lower gain limit $\gamma_L$ 516. The output of maximum signal processor 514 is input into minimum signal processor 518, which does not allow the signal to pass above maximum gain $\gamma_H$ 520. The output of minimum signal processor 518 is minimum overall gain control signal 328. Thus, 514 and 518 place lower and upper limits on minimum overall gain control signal 328 (which can be viewed as a projection onto a convex set operator). The resulting minimum overall gain adaptation is then given by the equation:

$$\gamma_{min}(m)=\mathrm{Min}\{\mathrm{Max}\{\gamma_{min}(m-1)+\mu u(m)[SNRI(m)-SNRI_{REF}(m)],\gamma_L\},\gamma_H\}.$$

Minimum overall gain control signal 328 is output for each frame, and can vary frame-by-frame, or by any other ratio of frames, e.g., every $3^{rd}$ frame (in which case the above update equation would be based on $\gamma_{min}(m-3)$). In some embodiments, SNR improvement reference signal 340 can be fixed at a desired level. For example, SNR improvement reference signal 340 can be set in the range between −30 dB and 0 dB. Alternatively, SNR improvement reference signal 340 can vary over time. For example, the SNR reference level can be adjusted depending upon the characteristics of input signal 204 (e.g., whether input signal 204 is voice, noise, signaling tone, etc. . . . ). Furthermore, the step size μ 506 can also be adjusted in order to increase or decrease the minimum overall gain adaptation speed. Alternatively, other adaptive algorithms may also be used to adjust minimum overall gain signal 328. In one embodiment, the step size can be set to μ=⅛.

Figure 6:
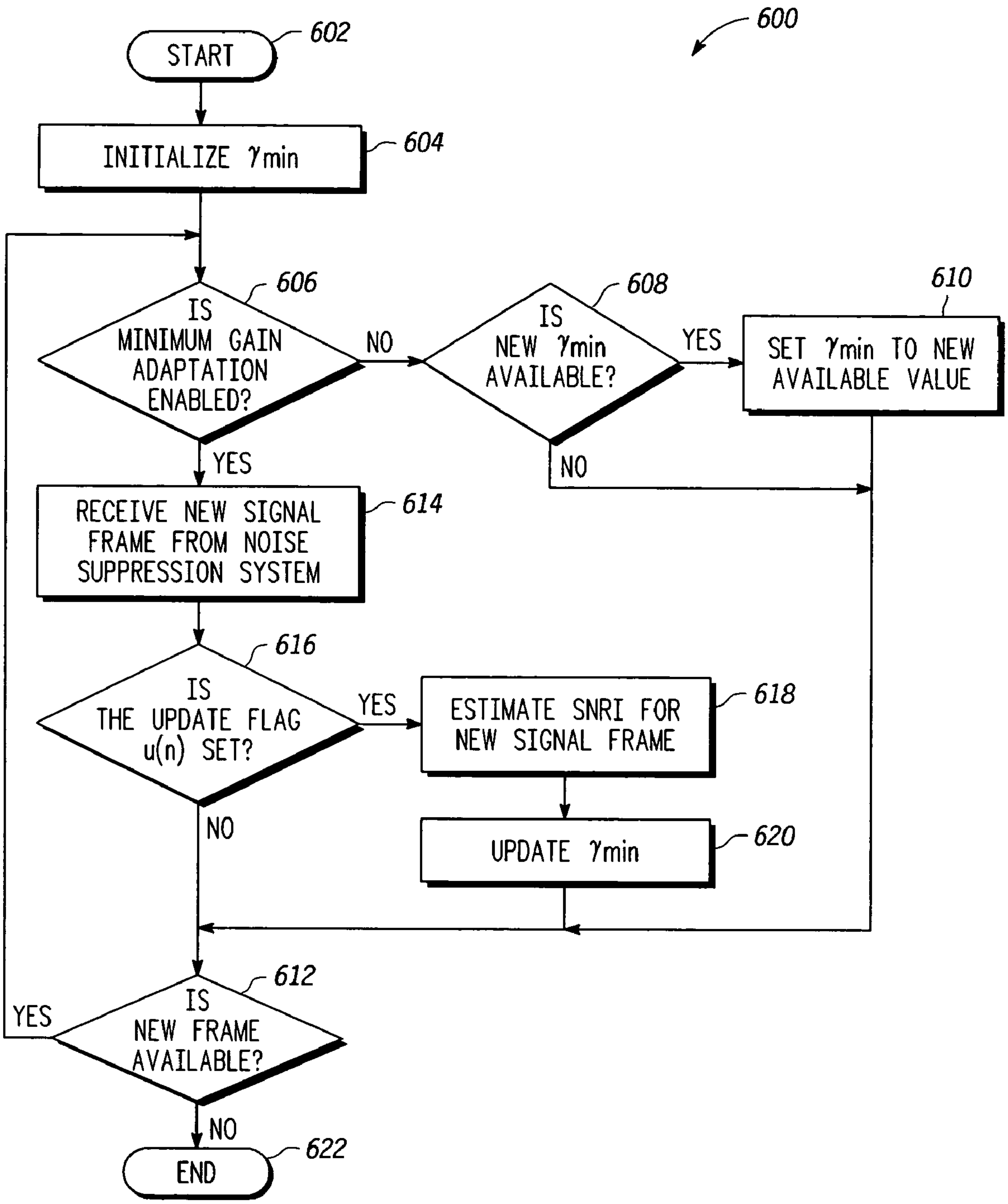
FIG. 6 shows a high-level flowchart of processes executed by a noise suppressor system that can be used in conjunction with the FIG. 2 voice enhancement device in accordance with one or more embodiments.

Referring now to the operation of the noise suppressor system, in FIG. 6 there is depicted a high-level flowchart 600 of exemplary processes executed by portions of a noise suppressor system, such as noise suppressor system 206, which is shown in voice enhancement device 102 of FIG. 2, or executed by another similar apparatus, in accordance with one or more embodiments. As illustrated, the process begins at 602, and thereafter passes to 604 wherein the process initializes the minimum overall gain $\gamma_{min}(m)$. This can be implemented by setting minimum overall gain control signal 328 to a preselected value (e.g., at −13 dB).

Next, the process determines whether the minimum gain adaptation process is enabled, as shown at 606. If the minimum gain adaptation is not enabled, the process determines whether a new minimum overall gain value is available, as illustrated at 608. If the new minimum overall gain value is available, the process sets the current minimum overall gain value to the new minimum overall gain value, as depicted at 610. This process can be implemented by comparing a current minimum overall gain in a noise reduction processor to a new value for the minimum overall gain, and replacing the current minimum overall gain with the new minimum overall gain when the values are different.

After the new minimum overall gain value has been set, or after it has been determined that there is no new value, the process passes to 612, wherein the process determines if new frames are available. If new frames are available, voice signal processing continues, and the process iteratively returns to 606.

If, at 606, the process determines that the minimum overall gain adaptation process is enabled, the process receives new frames of input and output signals as depicted at 614, wherein the signals are time-domain signals input into, and output from, the noise suppressor, such as noise suppressor 302 in FIG. 3. The new frames of input and output signals correspond to input signal e(n) 204 and output signal s(n) 208, which are shown in FIGS. 2, 3 and 4.

After receiving new frames of data, the process determines whether the update flag u(n) is set to indicate a noise sample, as illustrated at 616. The update flag u(n) can be implemented with noise indicator signal 316, as shown in FIG. 3 as the output of noise update indicator 314. Noise indicator signal 316 is a binary signal that, when set, indicates that a sample currently being processed is noise.

If the update flag (noise indicator signal) u(n) is set, the process estimates a new SNR improvement for the new signal frame, as illustrated at 618. The process of estimating a new SNR improvement can be implemented in the time-domain according to the process described and illustrated in FIG. 4, wherein SNRI(m) 332 is computed.

After estimating the SNR improvement, the process updates the minimum overall gain $\gamma_{min}(m)$, as depicted at 620. This process can be implemented as described and illustrated in FIG. 5, wherein SNRI(m) 332 and $SNRI_{REF}(m)$ 340 are used to compute a minimum overall gain control signal 328 that sets a new minimum overall gain $\gamma_{min}(m)$ in gain calculator 322 of noise suppressor 302 shown in FIG. 3.

After calculating and updating a new minimum overall gain at 620, the process passes to 612 to determine whether new frames are available. If new frames are available, the process iteratively returns to 606 to begin the process again for the new frame of data. If there are no new frames available, the process terminates at 622. The process can terminate when, for example, a telephone call ends and there are no new frames of voice data to process.

It should be apparent to those skilled in the art that the method and system described herein provides a number of improvements over the prior art. First, the minimum overall gain of the noise suppressor is not a fixed value, which can restrict the ability of the noise suppressor to further improve the SNR. Second, the method and system described herein can provide a larger minimum overall gain value, which may be needed in case multiple noise suppressors are connected in cascade. Third, one or more embodiments provide for adjusting the noise suppressor in order to deliver some target SNR improvement, regardless of the statistical characteristics of the noise signal. Fourth, the use of a time-varying SNR reference signal is capable of handling different signal conditions (e.g., emphasizing voice segments of input signal 204, if voice encoding is required).

Experiments with the method and system described herein have shown that the minimum overall gain has an average behavior of a near-linear relationship with respect to SNR improvement (i.e., noise suppression level), thus enabling a quite simple and low-cost control mechanism for achieving a target SNR improvement, as disclosed above. Persons skilled in the art frequently regard the use of SNR as a non-preferred method for noise suppression because it may also affect voiced segments of the signal. The method and system described herein can remove this limitation, as the disclosed minimum gain adapter (see 336 in FIGS. 3 and 5) may use any arbitrary target SNR improvement function of time.

The above described functions and structures can be implemented in one or more integrated circuits. For example, many or all of the functions can be implemented in the signal and data processing circuitry that is suggested by the block diagrams and schematic diagrams shown in FIGS. 1-5.

The processes, apparatus, and systems, discussed above, and the inventive principles thereof are intended to produce a more effective noise suppression system. By changing and adapting the minimum overall gain, a noise suppressor can more aggressively suppress noise in parts of the speech data stream while being less aggressive in other parts of the data stream. Additional effectiveness is gained when the correction of a frequency-domain process is computed in the time-domain, as the actual output signal from the noise suppressor is processed by a post-filtering analyzer, which can be used to adjust the noise suppressor to achieve noise suppression performance according to a selected SNR improvement.

This disclosure is intended to explain how to fashion and use various embodiments in accordance with the invention, rather than to limit the true, intended, and fair scope and spirit thereof. The foregoing description is not intended to be exhaustive or to limit the invention to the precise form disclosed. Modifications or variations are possible in light of the above teachings. The embodiment(s) were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of suppressing noise in an input signal comprising:

setting a minimum overall gain in a noise reduction processor for processing a first frame of data associated with the input signal;

replacing, in response to a new minimum overall gain being set, the minimum overall gain in the noise reduction processor with the new minimum overall gain; and processing a second frame of data associated with the input signal to suppress noise using the new minimum overall gain.

2. The method of suppressing noise according to claim 1 wherein the replacing the minimum overall gain comprises replacing the minimum overall gain with the new minimum overall gain, wherein the new minimum overall gain is a function of one or more of the input signal and an output signal of the noise reduction processor.

3. The method for suppressing noise according to claim 1 comprising:

outputting from the noise reduction processor a noise indicator; and calculating the new minimum overall gain using the input signal, an output signal, the noise indicator, and a reference signal.

4. The method for suppressing noise according to claim 1 wherein the replacing the minimum overall gain comprises:

estimating, using time domain data, a signal to noise ratio (SNR) improvement of the noise reduction processor;

computing the new minimum overall gain corresponding to a difference between a target SNR improvement and the estimated SNR improvement; and replacing the minimum overall gain in the noise reduction processor with the new minimum overall gain.

5. The method for suppressing noise according to claim 4 wherein the computing the new minimum overall gain comprises computing the new minimum overall gain using a least mean squares (LMS) algorithm and the difference between the target SNR improvement and the estimated SNR improvement.

6. The method for suppressing noise according to claim 4 comprising updating the target SNR improvement.

7. The method for suppressing noise according to claim 4 comprising initially setting the minimum overall gain to a negative value of the target SNR improvement.

8. A system for suppressing noise in an input signal comprising:

a frequency domain converter adapted to convert the input signal to a frequency domain signal;

a noise estimator adapted to estimate a noise level in the frequency domain signal;

a gain calculator adapted to calculate a gain based upon the estimated noise level and a minimum gain control signal, wherein the minimum gain control signal varies with a desired level of noise suppression;

a gain adjuster adapted to change the amplitude of the frequency domain signal based upon the gain to produce a filtered signal; and a time domain converter adapted to convert the filtered signal to an output signal in a time domain, wherein the system further comprises:

a post-filter analyzer coupled to the input signal and the output signal, for producing an improvement signal; and a minimum gain adapter coupled to the improvement signal and a reference signal for producing the minimum gain control signal.

9. The system for suppressing noise according to claim 8 wherein the minimum gain control signal is responsive to a signal to noise ratio (SNR) of the input signal, an SNR of the output signal, and a target SNR.

10. The system for suppressing noise according to claim 9 further comprising a noise indicator having an input coupled to the frequency domain signal, an input coupled to the SNR of the input signal, and having a noise indicator output signal responsive to a sample of the input signal being noise.

11. The system for suppressing noise according to claim 8 wherein the improvement signal is an SNR improvement signal responsive to a difference between an SNR of the input signal and an SNR of the output signal, and wherein the reference signal is an SNR target signal.

12. The system for suppressing noise according to claim 8 wherein the improvement signal is responsive to the noise indicator output signal.

13. A noise suppression device having adjustable noise suppression comprising:

a noise suppressor having a noise suppressor input, a noise suppressor output, a noise indicator output, and a minimum gain control input; and a noise suppressor controller having inputs coupled to the noise suppressor input, the noise suppressor output, and the noise indicator output, and having an output for outputting a minimum gain control signal, wherein the minimum gain control signal is coupled to the minimum gain control input, wherein the noise suppressor is adapted to have a minimum gain controlled by the minimum gain control signal.

14. The noise suppression device according to claim 13 wherein the noise suppressor comprises:

a frequency domain converter coupled to the noise suppressor input;

a gain modifier coupled to an output of the frequency domain converter;

a time domain converter having an input coupled to a gain modifier output, and an output coupled to the noise suppressor output; and a gain calculator having an input coupled to the minimum gain control signal, and an output coupled to the gain modifier and adapted to control the gain modifier in response to the minimum gain control signal.

15. The noise suppression device according to claim 14 wherein the noise suppressor comprises:

an energy estimator having an input coupled to the output of the frequency domain converter;

a noise estimator having an input coupled to an output of the energy estimator; and a signal-to-noise ratio (SNR) estimator having an input coupled to the output of the energy estimator, and an output coupled to an input of the gain calculator.

16. The noise suppression device according to claim 13 wherein the noise suppressor controller comprises:

a post-filter analyzer having inputs coupled to the noise suppressor input, and the noise suppressor output, and having an improvement signal output; and a minimum gain adapter having an input coupled to the improvement signal, an input coupled to a reference signal, and an output for outputting the minimum gain control signal.

17. The noise suppression device according to claim 16 wherein the post-filter analyzer has an input coupled to the noise indicator output.

18. The noise suppression device according to claim 16 wherein the minimum gain adapter has an input coupled to the noise indicator output.

19. The noise suppression device according to claim 13 comprising:

an echo canceller having an output coupled to the noise suppressor input; and a level controller having an input coupled to the noise suppressor output.

* * * * *